(12) United States Patent
Samoilov et al.

(10) Patent No.: US 7,737,007 B2
(45) Date of Patent: *Jun. 15, 2010

(54) METHODS TO FABRICATE MOSFET DEVICES USING A SELECTIVE DEPOSITION PROCESS

(75) Inventors: Arkadii V. Samoilov, Sunnyvale, CA (US); Yihwan Kim, Milpitas, CA (US); Errol Sanchez, Dublin, CA (US); Nicholas C. Dalida, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/201,681

(22) Filed: Aug. 29, 2008

(65) Prior Publication Data

US 2009/0011578 A1    Jan. 8, 2009

Related U.S. Application Data (60) Continuation of application No. 11/539,775, filed on Oct. 9, 2006, now Pat. No. 7,439,142, which is a division of application No. 10/845,984, filed on May 14, 2004, now Pat. No. 7,132,338, which is a continuation-in-part of application No. 10/683,937, filed on Oct. 10, 2003, now Pat. No. 7,166,528.

(51) Int. Cl.
*H01L 21/20* (2006.01)
(52) U.S. Cl. ............... 438/478; 438/494; 438/695; 438/300
(58) Field of Classification Search ............ 438/478, 438/483, 300, 494, 309, 695, 503
See application file for complete search history.

(56) References Cited

U.S. PATENT DOCUMENTS 3,675,619 A    7/1972    Burd (Continued)

FOREIGN PATENT DOCUMENTS

EP    1150345    10/2001

(Continued)

OTHER PUBLICATIONS

Argarwal, et al. "Challenges in integrating the High-K Gate Dielectric Film to the Conventional CMOS Process Flow," Mat. Sec. Soc. Sump. Proc. vol. 670 (2001) pp. K2.1.1-K2.1.11.

(Continued)

*Primary Examiner*—Savitri Mulpuri
(74) *Attorney, Agent, or Firm*—Patterson & Sheridan (57) ABSTRACT

In one embodiment, a method for forming a silicon-based material on a substrate having dielectric materials and source/drain regions thereon within a process chamber is provided which includes exposing the substrate to a first process gas comprising silane, methylsilane, a first etchant, and hydrogen gas to deposit a first silicon-containing layer thereon. The first silicon-containing layer may be selectively deposited on the source/drain regions of the substrate while the first silicon-containing layer may be etched away on the surface of the dielectric materials of the substrate. Subsequently, the process further provides exposing the substrate to a second process gas comprising dichlorosilane and a second etchant to deposit a second silicon-containing layer selectively over the surface of the first silicon-containing layer on the substrate.

16 Claims, 2 Drawing Sheets

U.S. PATENT DOCUMENTS

| | | |
|---|---|---|
| 4,429,324 A | 1/1984 | Wilkens et al. |
| 4,818,723 A | 4/1989 | Yen |
| 4,834,831 A | 5/1989 | Nishizawa et al. |
| 5,112,439 A | 5/1992 | Reisman et al. |
| 5,273,930 A | 12/1993 | Steele et al. |
| 5,288,658 A | 2/1994 | Ishihara et al. |
| 5,294,286 A | 3/1994 | Nishizawa et al. |
| 5,360,760 A | 11/1994 | Hayashi et al. |
| 5,372,860 A | 12/1994 | Fehlner et al. |
| 5,374,570 A | 12/1994 | Nasu et al. |
| 5,469,806 A | 11/1995 | Mochizuki et al. |
| 5,480,818 A | 1/1996 | Matsumoto et al. |
| 5,503,875 A | 4/1996 | Imai et al. |
| 5,521,126 A | 5/1996 | Okamura et al. |
| 5,527,733 A | 6/1996 | Nishizawa et al. |
| 5,674,304 A | 10/1997 | Fukada et al. |
| 5,693,139 A | 12/1997 | Nishizawa et al. |
| 5,796,116 A | 8/1998 | Nakata et al. |
| 5,807,792 A | 9/1998 | Ilg et al. |
| 5,846,867 A | 12/1998 | Gomi et al. |
| 5,906,680 A | 5/1999 | Meyerson |
| 5,908,307 A | 6/1999 | Talwar et al. |
| 5,916,365 A | 6/1999 | Sherman |
| 6,025,627 A | 2/2000 | Forbes et al. |
| 6,042,654 A | 3/2000 | Comita et al. |
| 6,064,081 A | 5/2000 | Robinson et al. |
| 6,069,060 A | 5/2000 | Matsumoto et al. |
| 6,124,158 A | 9/2000 | Dautartas et al. |
| 6,144,060 A | 11/2000 | Park et al. |
| 6,159,852 A | 12/2000 | Nuttall et al. |
| 6,200,893 B1 | 3/2001 | Sneh |
| 6,207,487 B1 | 3/2001 | Kim et al. |
| 6,228,728 B1 | 5/2001 | Furukawa et al. |
| 6,232,196 B1 | 5/2001 | Raaijmakers et al. |
| 6,235,568 B1 | 5/2001 | Murthy et al. |
| 6,270,572 B1 | 8/2001 | Kim et al. |
| 6,284,646 B1 | 9/2001 | Leem et al. |
| 6,284,686 B1 | 9/2001 | Marlor |
| 6,287,965 B1 | 9/2001 | Kang et al. |
| 6,291,319 B1 | 9/2001 | Yu et al. |
| 6,303,476 B1 | 10/2001 | Hawryluk et al. |
| 6,305,314 B1 | 10/2001 | Sneh et al. |
| 6,335,280 B1 | 1/2002 | van der Jeugd |
| 6,342,277 B1 | 1/2002 | Sherman |
| 6,348,420 B1 | 2/2002 | Raaijmakers et al. |
| 6,352,945 B1 | 3/2002 | Matsuki et al. |
| 6,358,829 B2 | 3/2002 | Yoon et al. |
| 6,383,955 B1 | 5/2002 | Matsuki et al. |
| 6,383,956 B2 | 5/2002 | Hawryluk et al. |
| 6,387,761 B1 | 5/2002 | Shih et al. |
| 6,391,785 B1 | 5/2002 | Satta et al. |
| 6,391,803 B1 | 5/2002 | Kim et al. |
| 6,399,491 B2 | 6/2002 | Jeon et al. |
| 6,410,463 B1 | 6/2002 | Matsuki et al. |
| 6,451,119 B2 | 9/2002 | Sneh et al. |
| 6,458,718 B1 | 10/2002 | Todd |
| 6,462,367 B2 | 10/2002 | Marsh et al. |
| 6,468,924 B2 | 10/2002 | Lee et al. |
| 6,489,241 B1 | 12/2002 | Thilderkvist et al. |
| 6,492,283 B2 | 12/2002 | Raaijmakers et al. |
| 6,492,711 B1 | 12/2002 | Takagi et al. |
| 6,511,539 B1 | 1/2003 | Raaijmakers et al. |
| 6,534,395 B2 | 3/2003 | Werkhoven et al. |
| 6,544,900 B2 | 4/2003 | Raaijmakers et al. |
| 6,559,520 B2 | 5/2003 | Matsuki et al. |
| 6,562,720 B2 | 5/2003 | Thilderkvist et al. |
| 6,596,095 B2 | 7/2003 | Ries |
| 6,620,670 B2 | 9/2003 | Song et al. |
| 6,630,413 B2 | 10/2003 | Todd |
| 6,632,279 B1 | 10/2003 | Ritala et al. |
| 6,635,588 B1 | 10/2003 | Hawryluk et al. |
| 6,645,838 B1 | 11/2003 | Talwar et al. |
| 6,797,558 B2 | 9/2004 | Nuttall et al. |
| 6,803,297 B2 | 10/2004 | Jennings et al. |
| 6,821,825 B2 | 11/2004 | Todd et al. |
| 6,839,507 B2 | 1/2005 | Adams et al. |
| 6,897,131 B2 | 5/2005 | Ramachandran et al. |
| 6,969,668 B1 | 11/2005 | Kang et al. |
| 6,998,305 B2 | 2/2006 | Arena et al. |
| 7,078,302 B2 | 7/2006 | Ma et al. |
| 7,132,338 B2 | 11/2006 | Samoilov et al. |
| 7,166,528 B2 | 1/2007 | Kim et al. |
| 7,439,142 B2 | 10/2008 | Samoilov et al. |
| 7,517,768 B2 * | 4/2009 | Soman et al. ............... 438/309 |
| 7,517,775 B2 | 4/2009 | Kim et al. |
| 2001/0000866 A1 | 5/2001 | Sneh et al. |
| 2001/0020712 A1 | 9/2001 | Raaijmakers et al. |
| 2001/0024387 A1 | 9/2001 | Raaijmakers et al. |
| 2001/0024871 A1 | 9/2001 | Yagi |
| 2001/0028924 A1 | 10/2001 | Sherman |
| 2001/0034123 A1 | 10/2001 | Jeon et al. |
| 2001/0041250 A1 | 11/2001 | Werkhoven et al. |
| 2001/0045604 A1 | 11/2001 | Oda et al. |
| 2001/0046567 A1 | 11/2001 | Matsuki et al. |
| 2001/0054381 A1 | 12/2001 | Umotoy et al. |
| 2001/0055672 A1 | 12/2001 | Todd |
| 2002/0000598 A1 | 1/2002 | Kang et al. |
| 2002/0016084 A1 | 2/2002 | Todd |
| 2002/0019148 A1 | 2/2002 | Hawryluk et al. |
| 2002/0022294 A1 | 2/2002 | Hawryluk et al. |
| 2002/0031618 A1 | 3/2002 | Sherman |
| 2002/0047151 A1 | 4/2002 | Kim et al. |
| 2002/0060363 A1 | 5/2002 | Xi et al. |
| 2002/0074588 A1 | 6/2002 | Lee |
| 2002/0076837 A1 | 6/2002 | Hujanen et al. |
| 2002/0090818 A1 | 7/2002 | Thilderkvist et al. |
| 2002/0093042 A1 | 7/2002 | Oh et al. |
| 2002/0098627 A1 | 7/2002 | Pomarede et al. |
| 2002/0117399 A1 | 8/2002 | Chen et al. |
| 2002/0142557 A1 | 10/2002 | Hashimoto et al. |
| 2002/0145168 A1 | 10/2002 | Bojarczuk et al. |
| 2002/0155722 A1 | 10/2002 | Satta et al. |
| 2002/0168868 A1 | 11/2002 | Todd |
| 2002/0172768 A1 | 11/2002 | Endo et al. |
| 2002/0173113 A1 | 11/2002 | Todd |
| 2002/0173130 A1 | 11/2002 | Pomerede et al. |
| 2002/0174827 A1 | 11/2002 | Samoilov et al. |
| 2002/0197831 A1 | 12/2002 | Todd et al. |
| 2002/0197881 A1 | 12/2002 | Ramdani et al. |
| 2003/0013320 A1 | 1/2003 | Kim et al. |
| 2003/0015764 A1 | 1/2003 | Raaijmakers et al. |
| 2003/0022528 A1 | 1/2003 | Todd |
| 2003/0032281 A1 | 2/2003 | Werkhoven et al. |
| 2003/0036268 A1 | 2/2003 | Brabant et al. |
| 2003/0045074 A1 | 3/2003 | Seibel et al. |
| 2003/0049942 A1 | 3/2003 | Haukka et al. |
| 2003/0060057 A1 | 3/2003 | Raaijmakers et al. |
| 2003/0062335 A1 | 4/2003 | Brewer |
| 2003/0072884 A1 | 4/2003 | Zhang et al. |
| 2003/0072975 A1 | 4/2003 | Shero et al. |
| 2003/0082300 A1 | 5/2003 | Todd et al. |
| 2003/0089308 A1 | 5/2003 | Raaijmakers |
| 2003/0089942 A1 | 5/2003 | Bhattacharyya |
| 2003/0101927 A1 | 6/2003 | Raaijmakers |
| 2003/0106490 A1 | 6/2003 | Jallepally et al. |
| 2003/0108674 A1 | 6/2003 | Chung et al. |
| 2003/0116804 A1 | 6/2003 | Visokay et al. |
| 2003/0124262 A1 | 7/2003 | Chen et al. |
| 2003/0129826 A1 | 7/2003 | Werkhoven et al. |
| 2003/0143841 A1 | 7/2003 | Yang et al. |
| 2003/0160277 A1 | 8/2003 | Bhattacharyya |
| 2003/0162370 A1 | 8/2003 | Sukegawa et al. |
| 2003/0166318 A1 | 9/2003 | Zheng et al. |
| 2003/0172872 A1 | 9/2003 | Thakur et al. |

| | | | |
|---|---|---|---|
| 2003/0173586 A1 | 9/2003 | Moriwaki et al. | |
| 2003/0185980 A1 | 10/2003 | Endo | |
| 2003/0186561 A1 | 10/2003 | Law et al. | |
| 2003/0188682 A1 | 10/2003 | Tois et al. | |
| 2003/0189208 A1 | 10/2003 | Law et al. | |
| 2003/0189232 A1 | 10/2003 | Law et al. | |
| 2003/0190423 A1 | 10/2003 | Yang et al. | |
| 2003/0190497 A1 | 10/2003 | Yang et al. | |
| 2003/0194853 A1 | 10/2003 | Jeon | |
| 2003/0198754 A1 | 10/2003 | Xi et al. | |
| 2003/0207555 A1 | 11/2003 | Takayanagi et al. | |
| 2003/0213560 A1 | 11/2003 | Wang et al. | |
| 2003/0213977 A1 | 11/2003 | Toyoda et al. | |
| 2003/0215570 A1 | 11/2003 | Seutter et al. | |
| 2003/0216981 A1 | 11/2003 | Tillman | |
| 2003/0232554 A1 | 12/2003 | Blum et al. | |
| 2003/0235961 A1 | 12/2003 | Metzner et al. | |
| 2004/0007747 A1 | 1/2004 | Visokay et al. | |
| 2004/0009307 A1 | 1/2004 | Koh et al. | |
| 2004/0009675 A1 | 1/2004 | Eissa et al. | |
| 2004/0016973 A1 | 1/2004 | Rotondaro et al. | |
| 2004/0023462 A1 | 2/2004 | Rotondaro et al. | |
| 2004/0033674 A1 | 2/2004 | Todd | |
| 2004/0033698 A1 | 2/2004 | Lee et al. | |
| 2004/0043149 A1 | 3/2004 | Gordon et al. | |
| 2004/0043569 A1 | 3/2004 | Ahn et al. | |
| 2004/0048439 A1* | 3/2004 | Soman et al. | 438/309 |
| 2004/0053484 A1 | 3/2004 | Kumar et al. | |
| 2004/0126999 A1 | 7/2004 | Ramachandran et al. | |
| 2004/0171238 A1 | 9/2004 | Arena et al. | |
| 2004/0198010 A1* | 10/2004 | Koumoto et al. | 438/312 |
| 2004/0224089 A1 | 11/2004 | Singh et al. | |
| 2004/0226911 A1 | 11/2004 | Dutton et al. | |
| 2004/0235229 A1 | 11/2004 | Hokazono | |
| 2004/0253776 A1 | 12/2004 | Hoffmann et al. | |
| 2005/0045905 A1 | 3/2005 | Chu et al. | |
| 2005/0054171 A1 | 3/2005 | Chu et al. | |
| 2005/0079691 A1 | 4/2005 | Kim et al. | |
| 2005/0079692 A1 | 4/2005 | Samoilov et al. | |
| 2005/0170604 A1 | 8/2005 | Orlowski et al. | |
| 2005/0186765 A1 | 8/2005 | Ma et al. | |
| 2005/0241671 A1 | 11/2005 | Dong et al. | |
| 2005/0250298 A1 | 11/2005 | Bauer | |
| 2005/0263795 A1 | 12/2005 | Choi et al. | |
| 2006/0060920 A1 | 3/2006 | Paranjpe et al. | |
| 2006/0115933 A1 | 6/2006 | Ye et al. | |
| 2006/0115934 A1 | 6/2006 | Kim et al. | |
| 2006/0166414 A1 | 7/2006 | Carlson et al. | |
| 2006/0169668 A1 | 8/2006 | Samoilov | |
| 2006/0169669 A1 | 8/2006 | Zojaji et al. | |
| 2006/0216876 A1 | 9/2006 | Kim et al. | |
| 2006/0234488 A1 | 10/2006 | Kim et al. | |
| 2006/0260538 A1 | 11/2006 | Ye et al. | |
| 2006/0286763 A1 | 12/2006 | Ma et al. | |
| 2006/0286774 A1 | 12/2006 | Singh et al. | |
| 2006/0286775 A1 | 12/2006 | Singh et al. | |
| 2006/0286776 A1 | 12/2006 | Ranish et al. | |
| 2006/0286819 A1 | 12/2006 | Seutter et al. | |
| 2006/0286820 A1 | 12/2006 | Singh et al. | |
| 2007/0066023 A1 | 3/2007 | Thakur et al. | |
| 2007/0082451 A1 | 4/2007 | Samoilov et al. | |

FOREIGN PATENT DOCUMENTS

| | | |
|---|---|---|
| EP | 1598881 | 11/2005 |
| GB | 2355727 | 5/2001 |
| JP | 58098917 | 6/1983 |
| JP | 62171999 | 7/1987 |
| JP | 63062313 | 3/1988 |
| JP | 01111000 | 4/1989 |
| JP | 01143221 | 6/1989 |
| JP | 01189312 | 7/1989 |
| JP | 01270593 | 10/1989 |
| JP | 02172895 | 7/1990 |
| JP | 03286522 | 12/1991 |
| JP | 05047665 | 2/1993 |
| JP | 05102189 | 4/1993 |
| JP | 05251339 | 9/1993 |
| JP | 06196809 | 7/1994 |
| JP | 2001111000 | 4/2001 |
| JP | 2001172767 | 6/2001 |
| JP | 2001189312 | 7/2001 |
| WO | WO-9820524 | 5/1998 |
| WO | WO-0016377 | 3/2000 |
| WO | WO-0054320 | 9/2000 |
| WO | WO-0115220 | 3/2001 |
| WO | WO-0117692 | 3/2001 |
| WO | WO-0129893 | 4/2001 |
| WO | WO-0140541 | 6/2001 |
| WO | WO-0141544 | 6/2001 |
| WO | WO-0166832 | 9/2001 |
| WO | WO-0171787 | 9/2001 |
| WO | WO-0243115 | 5/2002 |
| WO | WO-0245167 | 6/2002 |
| WO | WO-02064853 | 8/2002 |
| WO | WO-02065508 | 8/2002 |
| WO | WO-02065516 | 8/2002 |
| WO | WO-02065517 | 8/2002 |
| WO | WO-02065525 | 8/2002 |
| WO | WO-02080244 | 10/2002 |
| WO | WO-02097864 | 12/2002 |
| WO | WO-2005038890 | 4/2005 |

OTHER PUBLICATIONS

Bedair "Atomic Layer Epitaxy Deposition Processes," J. Vac. Sci. Technol. B., vol. 12, No. 1, Jan.Feb. 1994.

Chinese Office Action for Chinese Application No. 200580006136.2 dated May 23, 2008.

Choi, et al. "Stability of $TiB_2$ as a Diffusion Barrier on Silicon," J. Electrochem. Soc., vol. 138, No. 10, Oct. 1991, pp. 3062-3067.

Choi, et al. "The Effect of Annealing on Resistivity of Low Pressure Chemical Vapor Deposited Titanium Diboride," J. Appl. Phys. 69(11), Jun. 1, 1991.

Debusschere, et al. "Importance of determining the polysilicon dopant profile during process development," J. Vac. Sci. Technol. B 14(1), Jan./Feb. 1996.

Derbyshire "Applications of Integrated Processing," Solid State Technology, Dec. 1994, pp. 45-48.

Earles, et al. "Nonmelt Laser Annealing of 5-KeV and 1-KeV Boron-Implanted Silicon," IEEE Transactions on Electron Devices, vol. 49, No. 7, Jul. 2002.

Elers, et al. "$NbCl_5$ as a Precursor in Atomic Layer Epitaxy," Applied Surface Science 8283 (1994), pp. 468-474.

George, et al. "Surface Chemistry for Atomic Layer Growth," J. Phys. Chem. 1996, 100, pp. 13121-13131.

Goto, et al. "Ultra-Low Contact Resistance for Deca-nm MOSFETs by Laser Annealing," Electron Devices Meeting, 1999. IEDM Technical Digest. International Washington, DC, USA Dec. 5-8, 1999, Piscataway, NJ, USA, IEEE, US, Dec. 5, 1999, pp. 931-933, XP010372206.

Hwang, et al. "Nanometer-Size α-$PbO_2$-Type $TiO_2$ in Garnet: A Thermobarometer for Ultrahigh-Pressure Metamorphism," Science vol. 288 (Apr. 14, 2000) pp. 321-324.

International Search Report and Written Opinion dated Mar. 30, 2006 for International Application No. PCT/US2005/016160.

International Search Report dated Feb. 22, 2005 for International Application No. PCT/US2004/030872.

Invitation to Pay Additional Fees and Partial International Search Report for PCT/US2005/016160.

Jeong, et al. "Growth and Characterization of Aluminum Oxide ($Al_2O_3$) Thin Films by Plasma-Assisted Atomic Layer Controlled Deposition," J. Korean Inst. Met. Mater., vol. 38, No. 10, Oct. 2000, pp. 1395-1399.

Jeong, et al. "Plasma-assisted Atomic Layer Growth of High-Quality Aluminum Oxide Thin Films," Jpn. J. Appl. Phys. 1, Regul. Pap. Short Notes, vol. 40, No. 1, Jan. 2001, pp. 285-289.

Kamins, et al. Kinetics of selective epitaxial deposition of $Si_{1-x}Ge_x$, Applied Physics Letters, American Institute pf Physics. New York, US, vol. 61, No. 6, Aug. 10, 1992, pp. 669-671.

Lee, et al. "Cyclic Technique for the Enhancement of Highly Oriented Diamond Film Growth," Thin Solid Films 303 (1997) pp. 264-269.

Menon, et al. "Loading effect in SiGe layers grown by dichlorosilane- and silane-based epitaxy", Journal of Applied Physics, American Institute of Physics. New York, US, vol. 90, No. 9, Nov. 1, 2001, pp. 4805-4809.

Mercier, et al. "Kinetic Aspects of Selective Epitaxial Growth Using a Rapid Thermal Processing System", Journal or Crystal Growth, 94, pp. 885-894 (1989).

Min, et al. "Chemical Vapor Deposition of Ti—Si—N Films with Alternating Source Supply," Mat. Res. Soc. Symp. Proc. vol. 564 (1999) pp. 207-210.

Min, et al. "Metal-organic Atomic-layer Deposition of Titanium-silicon-nitride Films," Applied Physics Letters, vol. 75, No. 11 (Sep. 11, 1999) pp. 1521-1523.

Miyauchi, et al. "Low-Temperature (850° C.) Silicon Selective Epitaxial Growth on HF-Treated Si(100) Substrates Using $SiH_4$-$HCl$-$H_2$ Systems," J.Electrochem. Soc., vol. 138, No. 11, Nov. 1991, pp. 3480-3483.

Paranjpe, et al. "Atomic Layer Deposition of $AlO_x$ for Thin Film Head Gap Applications," J. Electrochem. Soc., vol. 148, No. 9, Sep. 2001, pp. G465-G471.

PCT International Search Report and the Written Opinion for International Application No. PCTUS0542991 dated Nov. 20, 2006.

Ribot, et al. "Low-temperature selective epitaxy of silicon with chlorinated chemistry by RTCVD," Materials Science and Engineering B89, pp. 306-309 (2002).

Ritala, et al. "Atomic Layer Deposition of Oxide Thin Films with Metal Alkoxides as Oxygen Sources," Science vol. 288 Apr. 14, 2000 pp. 319-321.

Sedgwick, et al. "Selective SiGe and heavily As doped Si deposited at low temperature by atmospheric pressure chemical vapor deposition", Journal of Vacuum Science and Technology: Part B, American Institute of Physics. New York, US, vol. 11, No. 3,May 1, 1993, pp. 1124-1128. cited by other.

Talwar, et al. "Junction sealing unsing lasers for thermal annealing," Solid State Technology, vol. 46, Issue 7, Jul. 2003.

Uchino, et al. "A Raised Source/Drain Technology Using In-situ P-doped SiGe and B-doped Si for 0.1 .mu.m CMOS ULSIs," Electron Devices Meeting, 1997, Technical Digest, International Washing, DC, USA Dec. 7-10, 1991, New York, NY, USA, IEEE, US, Dec. 7, 1997, pp. 479-482.

Yamshita, et al. "Kinetics of Boron Activation by Flash Lamp Annealing," Extend Abstracts of the 2003 International Conference of Solid State Devices and Materials, Tokyo, 2003, pp. 742-743.

* cited by examiner

METHODS TO FABRICATE MOSFET DEVICES USING A SELECTIVE DEPOSITION PROCESS

CROSS-REFERENCE TO RELATED APPLICATIONS

This application is a continuation of U.S. Ser. No. 11/539,775 (APPM/008539.D2), filed Oct. 9, 2006 now U.S. Pat. No. 7,439,142, which is a divisional of U.S. Ser. No. 10/845,984 (APPM/008539.P1), filed May 14, 2004, and issued as U.S. Pat. No. 7,132,338, which is a continuation-in-part of U.S. Ser. No. 10/683,937 (APPM/008539), filed Oct. 10, 2003, and issued as U.S. Pat. No. 7,166,528, which are herein incorporated by reference in their entirety.

BACKGROUND OF THE INVENTION

1. Field of the Invention

Embodiments of the invention generally relate to the field of semiconductor manufacturing processes and devices, more particular, to methods of depositing silicon-containing films forming semiconductor devices.

2. Description of the Related Art

As smaller transistors are manufactured, ultra shallow source/drain junctions are becoming more challenging to produce. According to the International Technology Roadmap for Semiconductors (ITRS), junction depth is required to be less than 30 nm for sub-100 nm CMOS (complementary metal-oxide semiconductor) devices. Recently, selective SiGe epitaxy has become a useful material to deposit during formation of elevated source/drain and source/drain extension features. Source/drain extension features are manufactured by etching silicon to make a recessed source/drain feature and subsequently filling the etched surface with a selectively grown SiGe epilayer. Selective epitaxy permits near complete dopant activation with in-situ doping, so that the post annealing process is omitted. Therefore, junction depth can be defined accurately by silicon etching and selective epitaxy. On the other hand, the ultra shallow source/drain junction inevitably results in increased series resistance. Also, junction consumption during silicide formation increases the series resistance even further. In order to compensate for junction consumption, an elevated source/drain is epitaxially and selectively grown on the junction.

Selective Si-epitaxial deposition and SiGe-epitaxial deposition permits growth of epilayers on Si moats with no growth on dielectric areas. Selective epitaxy can be used in semiconductor devices, such as within elevated source/drains, source/drain extensions, contact plugs, and base layer deposition of bipolar devices. Generally, a selective epitaxy process involves two reactions: deposition and etch. The deposition and etch occur simultaneously with relatively different reaction rates on Si and on dielectric surface. A selective process window results in deposition only on Si surfaces by changing the concentration of an etchant gas (e.g., HCl).

Although SiGe-epitaxial deposition is suitable for small dimensions, this approach does not readily prepare doped SiGe, since the dopants react with HCl. The process development of heavily boron doped (e.g., higher than $5 \times 10^{19}$ $cm^{-3}$) selective SiGe-epitaxy is a much more complicated task because boron doping makes the process window for selective deposition narrow. Generally, when more boron concentration (e.g., $B_2H_6$) is added to the flow, a higher HCl concentration is necessary to achieve selectivity due to the increase growth rate of deposited film(s) on any dielectric areas. This higher HCl flow rate reduces boron incorporation into the epilayers presumably because the B—Cl bond is stronger than Ge—Cl and Si—Cl bonds.

Currently, there are two popular applications for selective silicon-based epitaxy in junction formation of silicon-containing MOSFET (metal oxide semiconductor field effect transistor) devices. One application is the process to deposit elevated source/drain (S/D) films by a selective epitaxy. Typically, this epitaxial layer is undoped silicon. Another application is filling of recessed junction areas with epitaxial silicon-containing films. Often, the silicon-based films contain germanium, carbon and/or a dopant.

MOSFET devices may contain a PMOS or a NMOS component, whereas the PMOS has a p-type channel, i.e., holes are responsible for conduction in the channel and the NMOS has an n-type channel, i.e., the electrons are responsible for conduction in the channel. For PMOS, the film in the recessed area is usually SiGe. For NMOS application, the film in the recessed area may be SiC. SiGe is used for PMOS application for several reasons. A SiGe material incorporates more boron than silicon alone, thus the junction resistivity is lowered. Also, the SiGe/silicide layer interface at the substrate surface has a lower Schottky barrier than the Si/silicide interface. Further, SiGe grown epitaxially on the top of silicon has compressive stress inside the film because the lattice constant of SiGe is larger than that of silicon. The compressive stress is transferred in the lateral dimension to create compressive strain in the PMOS channel and to increase mobility of the holes. For NMOS application, SiC can be used in the recessed areas to create tensile stress in the channel, since the lattice constant of SiC is smaller than that of silicon. The tensile stress is transferred into the channel and increases the electron mobility.

Therefore, there is a need to have a process for selectively and epitaxially depositing silicon and silicon-containing compounds with an enriched dopant concentration. Furthermore, the process should be versatile to form silicon-containing compounds with varied elemental concentrations.

SUMMARY OF THE INVENTION

In one embodiment, a method for fabricating a silicon-based device on a substrate surface is provided which includes depositing a first silicon-containing layer by exposing the substrate surface to a first process gas comprising $Cl_2SiH_2$, a germanium source, a first etchant and a carrier gas and depositing a second silicon-containing layer by exposing the first silicon-containing layer to a second process gas comprising $SiH_4$ and a second etchant.

In another embodiment, a method for forming a silicon-based device on a substrate surface in a process chamber is provided which includes depositing a silicon-containing layer by exposing the substrate surface to a process gas comprising $Cl_2SiH_2$, $Cl_2SiH_2$, HCl, and $H_2$. In one aspect, the process gas comprises $Cl_2SiH_2$ at a flow rate in a range from about 20 sccm to about 400 sccm, $CH_3SiH_3$ at a flow rate in a range from about 0.3 sccm to about 5 sccm, HCl at a flow rate in a range from about 30 sccm to about 500 sccm, and $H_2$ at a flow rate in a range from about 10 slm to about 30 slm.

In another embodiment, a method for fabricating a silicon-based device on a substrate surface in a process chamber is provided which includes depositing a first silicon-containing layer by exposing the substrate surface to a process gas comprising $SiH_4$, $CH_3SiH_3$, HCl, and $H_2$. In one aspect, the process gas comprises $SiH_4$ at a flow rate in a range from about 20 sccm to about 400 sccm, $CH_3SiH_3$ at a flow rate in a range from about 0.3 sccm to about 5 sccm, HCl at a flow rate in a range from about 30 sccm to about 500 sccm and $H_2$ at a flow rate in a range from about 10 slm to about 30 slm.

In another embodiment, a method for fabricating a silicon-based device on a substrate surface in a process chamber is provided which includes depositing a first silicon-containing layer by exposing the substrate surface to a process gas comprising $SiH_4$, $GeH_4$, $CH_3SiH_3$, HCl, and $H_2$. In one aspect, the process gas comprises $SiH_4$ at a flow rate in a range from about 50 sccm to about 200 sccm, $GeH_4$ at a flow rate in a range from about 0.5 sccm to about 5 sccm, $CH_3SiH_3$ at a flow rate in a range from about 0.3 sccm to about 5 sccm, HCl at a flow rate in a range from about 30 sccm to about 500 sccm and $H_2$ at a flow rate in a range from about 10 slm to about 30 slm.

In another embodiment, a method for forming a silicon-based material on a substrate surface is provided which includes exposing the substrate surface to a process gas, depositing a first silicon-based layer with a crystalline lattice on the substrate surface containing less than 3 atomic percent (at %) carbon in interstitial sites of the crystalline lattice, and annealing the first silicon-based layer to incorporate at least a portion of the less than 3 at % carbon in substitutional sites of the crystalline lattice.

In another embodiment, a method for depositing a silicon-containing material on a substrate surface is provided which includes depositing a first silicon-containing layer on the substrate surface with a first germanium concentration of about 24 at % or less, depositing on the first silicon-containing layer a second silicon-containing layer wherein a second germanium concentration of about 25 at % or more of the second silicon-containing layer, and depositing on the second silicon-containing layer a third silicon-containing layer containing a third germanium concentration less than about 5 at % of the third silicon-containing layer.

In another embodiment, a method for depositing a silicon-containing material on a substrate surface is provided which includes depositing a first silicon-containing layer on the substrate surface with a first germanium concentration of about 15 at % or more. The method further provides depositing on the first silicon-containing layer a second silicon-containing layer wherein a second germanium concentration of about 15 at % or less, exposing the substrate surface to air to form a native oxide layer, removing the native oxide layer to expose the second silicon-containing layer, and depositing a third silicon-containing layer on the second silicon-containing layer.

In another embodiment, a method for depositing a silicon-containing material on a substrate surface is provided which includes depositing epitaxially a first silicon-containing layer on the substrate surface with a first lattice strain, and depositing epitaxially on the first silicon-containing layer a second silicon-containing layer with a second lattice strain greater than the first lattice strain.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

The invention provides a process to epitaxially deposit silicon-containing compounds during the manufacture of various device structures. In some embodiments, the process utilizes the silicon precursor silane ($SiH_4$) during the deposition of silicon-containing materials. In some embodiments, the process utilizes the silicon precursor dichlorosilane ($Cl_2SiH_2$) during the deposition of silicon-containing materials. In other embodiments, a step-wise process using dichlorosilane in one step and silane in a later step is effective for depositing silicon-containing materials for silicon-based devices, in order to minimize defects in epitaxial layers.

Embodiments of the present invention teach processes to grow films of selective, epitaxial silicon-containing compounds. Selective silicon containing film growth generally is conducted when the substrate or surface includes more than one material, such as exposed single crystalline silicon surface areas and features that are covered with dielectric material, such as oxide or nitride layers. Usually, these features are dielectric material. Selective epitaxial growth to the crystalline, silicon surface is achieved while the feature is left bare, generally, with the utilization of an etchant (e.g., HCl). The etchant removes amorphous silicon or polysilicon growth from features quicker than the etchant removes crystalline silicon growth from the substrate, thus selective epitaxial growth is achieved.

Throughout the application, the terms "silicon-containing" materials, compounds, films or layers should be construed to include a composition containing at least silicon and may contain germanium, carbon, boron, arsenic and/or phosphorus. Other elements, such as metals, halogens or hydrogen may be incorporated within a silicon-containing material, film or layer, usually as impurities. Compounds or alloys of silicon-containing materials may be represented by an abbreviation, such as Si for silicon, SiGe, for silicon germanium, SiC for silicon carbon and SiGeC for silicon germanium carbon. The abbreviations do not necessarily represent chemical equations with stoichiometrical relationships, nor represent any particular reduction/oxidation state of the silicon-containing materials.

Figure 1A:
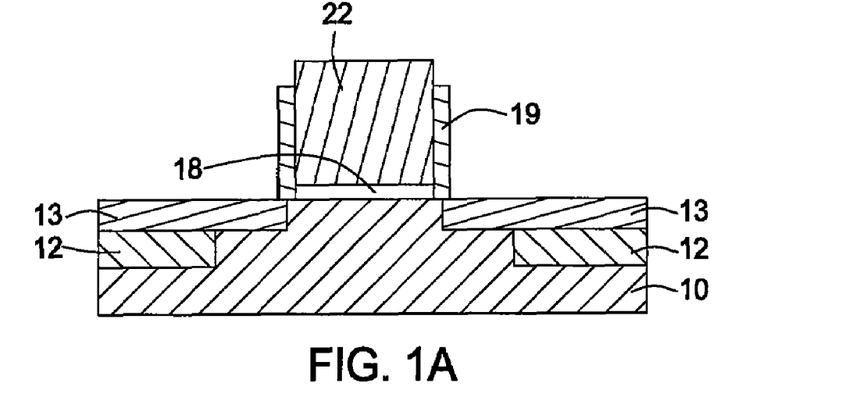
FIGS. 1A-C show several devices with epitaxially deposited silicon-containing layer.
Figure 1B:
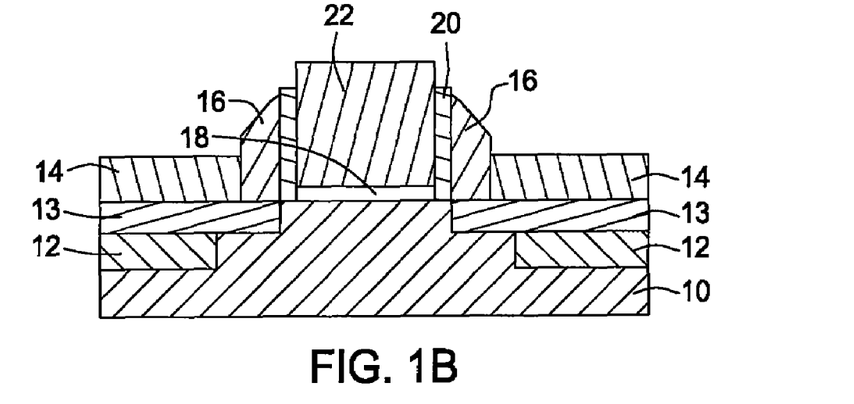
Figure 1C:
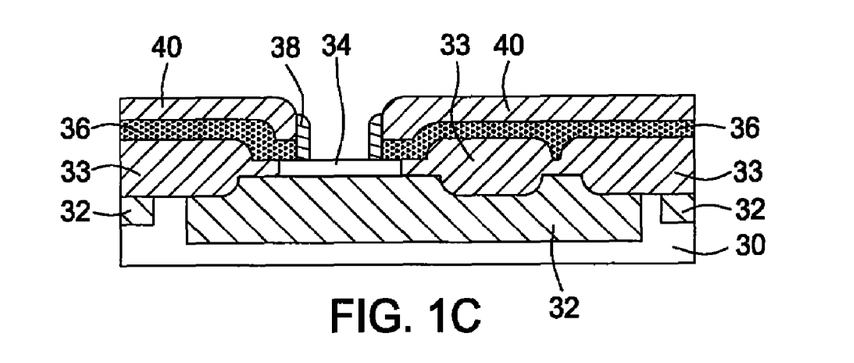

The processes are extremely useful while depositing silicon-containing layers in MOSFET and bipolar transistors as depicted in FIGS. 1A-1C. Herein, silicon-containing compounds are the deposited layers or films and include Si, SiGe, SiC, SiGeC, doped variants thereof and combinations thereof, epitaxially grown during the processes of the present invention. The silicon-containing compounds include strained or unstrained layers within the films.

FIGS. 1A-1B show the epitaxially grown silicon-containing compounds on a MOSFET. The silicon-containing compound is deposited to the source/drain features of the device. The silicon-containing compound adheres and grows from the crystal lattice of the underlying layer and maintains this arrangement as the silicon-containing compound grows with thickness. In one embodiment, FIG. 1A demonstrates the silicon-containing compound deposited as a recessed source/drain, while in another embodiment, FIG. 1B shows silicon-containing compounds deposited as a recessed source/drain and an elevated source/drain (ESD).

The source/drain layer 12 is formed by ion implantation of the substrate 10. Generally, the substrate 10 is doped n-type while the source/drain layer 12 is doped p-type. Silicon-containing layer 13 is selectively and epitaxially grown to the source/drain layer 12 or directly to substrate 10 by the various embodiments of the present invention. Silicon-containing layer 14 is selectively and epitaxially grown to the silicon-containing layer 13 by the various embodiments of the present invention. Gate oxide layer 18 bridges the segmented silicon-containing layer 13. Generally, gate oxide layer 18 is composed of silicon dioxide, silicon oxynitride or hafnium oxide. Partially encompassing the gate oxide layer 18 is a spacer 16, which is usually an isolation material such as a nitride/oxide stack (e.g., $Si_3N_4/SiO_2/Si_3N_4$). Gate layer 22 (e.g., polysilicon) may have a protective layer 19, such as silicon dioxide, along the perpendicular sides, as in FIG. 1A. Alternately, gate layer 22 may have a spacer 16 and off-set layers 20 (e.g., $Si_3N_4$) disposed on either side.

In another embodiment, FIG. 1C depicts the deposited silicon-containing compound layer 34 as a base layer of a bipolar transistor. The silicon-containing compound layer 34 is epitaxially grown with the various embodiments of the invention. The silicon-containing compound layer 34 is deposited to an n-type collector layer 32 previously deposited to substrate 30. The transistor further includes isolation layer 33 (e.g., $SiO_2$ or $Si_3N_4$), contact layer 36 (e.g., heavily doped poly-Si), off-set layer 38 (e.g., $Si_3N_4$), and a second isolation layer 40 (e.g., $SiO_2$ or $Si_3N_4$).

Figure 2A:
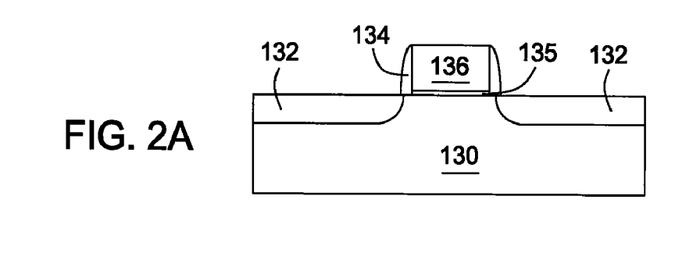
FIGS. 2A-F show schematic illustrations of fabrication techniques for a source/drain extension device within a MOSFET.
Figure 2B:
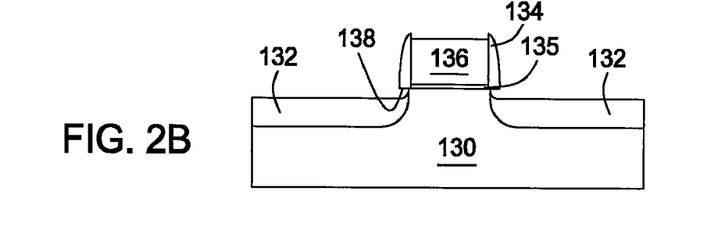

In one embodiment, as depicted in FIGS. 2A-2F, a source/drain extension is formed within a MOSFET wherein the silicon-containing layers are epitaxially and selectively deposited on the surface of the substrate. FIG. 2A depicts a source/drain layer 132 formed by implanting ions into the surface of a substrate 130. The segments of source/drain layer 132 are bridged by the gate 136 formed on gate oxide layer 135 and subsequent deposition of off-set layer 134. A portion of the source/drain layer is etched and wet-cleaned, to produce a recess 138, as in FIG. 2B. A portion of gate 136 may also be etched, or optionally a hardmask may be deposited prior to etching to avoid gate material removal.

Figure 2C:
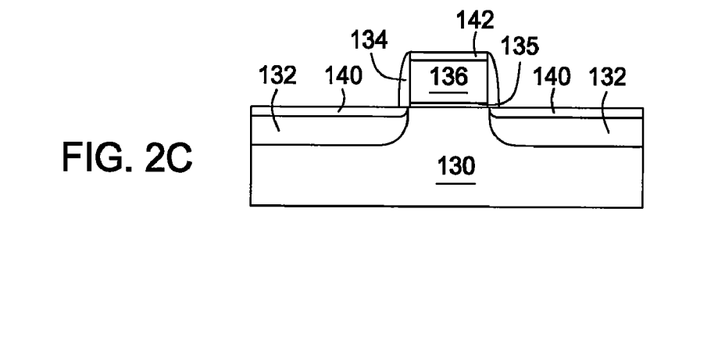

FIG. 2C illustrates several embodiments of the present invention, in which silicon-containing layers 140 (epitaxial) and 142 (polycrystalline) are selectively deposited. Silicon-containing layer 142 is optionally omitted by depositing a hardmask over gate 136 prior to depositing silicon-containing layer 140. Silicon-containing compound layers 140 and 142 are deposited simultaneously without depositing on the off-set layer 134. In one embodiment, silicon-containing layers 140 and 142 are SiGe-containing layers with a germanium concentration at about 1 at % to about 50 at %, preferably about 24 at % or less. Multiple SiGe-containing layers containing varying amount of elements may be stacked to form silicon-containing layer 140 with a graded elemental concentration. For example, a first SiGe-layer may be deposited with a germanium concentration in a range from about 15 at % to about 25 at % and a second SiGe-layer may be deposited with a germanium concentration in a range from about 25 at % to about 35 at %.

In another embodiment, silicon-containing layers 140 and 142 are SiC-containing layers with a carbon concentration from about 200 ppm to about 5 at %, preferably about 3 at % or less, for example, from about 1 at % to about 2 at %, about 1.5 at %. In another embodiment, silicon-containing layers 140 and 142 are SiGeC-containing layers with a germanium concentration from about 1 at % to about 50 at %, preferably about 24 at % or less and a carbon concentration at about 200 ppm to about 5 at %, preferably about 3 at % or less, more preferably from about 1 at % to about 2 at %, for example, about 1.5 at %.

Multiple layers containing Si, SiGe, SiC, or SiGeC may be deposited in varying order to form graded elemental concentrations of silicon-containing layer 140. The silicon-containing layers are generally doped with a dopant (e.g., B, As or P) having a concentration in the range from about $1 \times 10^{19}$ atoms/$cm^3$ to about $2.5 \times 10^{21}$ atoms/$cm^3$, preferably from about $5 \times 10^{19}$ atoms/$cm^3$ to about $2 \times 10^{20}$ atoms/$cm^3$. Dopants added in individual layers of silicon-containing material forms graded dopant. For example, silicon-containing layer 140 is formed by depositing a first SiGe-containing layer with a dopant concentration (e.g., boron) at a range from about $5 \times 10^{19}$ atoms/$cm^3$ to about $1 \times 10^{20}$ atoms/$cm^3$ and a second SiGe-containing layer with a dopant concentration (e.g., boron) at a range from about $1 \times 10^{20}$ atoms/$cm^3$ to about $2 \times 10^{20}$ atoms/$cm^3$.

Carbon incorporated in SiC-containing layers and SiGeC-containing layers is generally located in interstitial sites of the crystalline lattice immediately following the deposition of the silicon-containing layer. The interstitial carbon content is about 10 at % or less, preferably less then 5 at % and more preferably from about 1 at % to about 3 at %, for example, about 2 at %. The silicon-containing layer may be annealed to incorporate at least a portion, if not all of the interstitial carbon into substitutional sites of the crystalline lattice. The annealing process may include a spike anneal, such as rapid thermal process (RTP), laser annealing or thermal annealing with an atmosphere of gas, such as oxygen, nitrogen, hydrogen, argon, helium or combinations thereof. The annealing process is conducted at a temperature from about 800° C. to about 1,200° C., preferably from about 1,050° C. to about 1,100° C. The annealing process may occur immediately after the silicon-containing layer is deposited or after a variety of other process steps the substrate will endure.

Figure 2D:
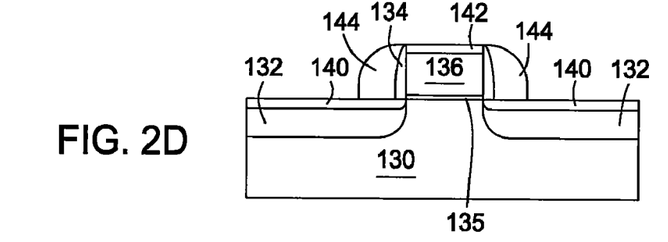

During the next step, FIG. 2D shows a spacer 144, generally a nitride spacer (e.g., $Si_3N_4$) deposited to the off-set layer 134. Spacer 144 is usually deposited in a different chamber. Therefore, the substrate is removed from the process chamber that was used to deposit silicon-containing layer 140. During the transfer between the two chambers, the substrate may be exposed to ambient conditions, such as the temperature, pressure or the atmospheric air containing water and oxygen. Upon depositing the spacer 144, or performing other semiconductor process (e.g., anneal, deposition, or implant), the substrate may be exposed to ambient conditions a second time prior to depositing silicon-containing layers 146 and 148. In one embodiment, an epitaxial layer (not shown) with no or minimal germanium (e.g., less than about 5 at %) is deposited on the top of layer 140 before exposing the substrate to ambient conditions since native oxides are easier to remove from epitaxial layers containing minimal germanium concentrations than from an epitaxial layer formed with a germanium concentration greater than about 5 at %.

Figure 2E:
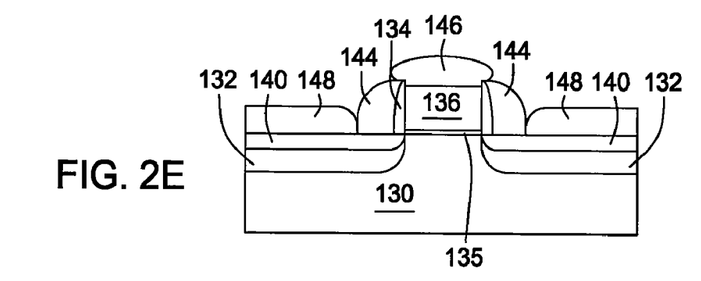

FIG. 2E depicts another embodiment of the present invention, in which a silicon-containing compound is epitaxially and selectively deposited as silicon-containing layer 148, an elevated layer. Silicon-containing layer 148 is deposited on layer 140 (e.g., doped-SiGe) while polysilicon is deposited on the silicon-containing layer 142 to produce polysilicon layer 146. Depending on the elemental concentrations of silicon-containing layer 142 and polysilicon deposited thereto, the elemental concentrations of polysilicon layer 146 will inheritably contain these elemental concentrations, including graded concentrations when both layers are different.

In a preferred embodiment, silicon-containing layer 148 is epitaxially deposited silicon containing little or no germanium or carbon. However, in another embodiment, silicon-containing layer 148 does contain germanium and/or carbon.

For example, silicon-containing layer 148 may have about 5 at % or less germanium. In another example, silicon-containing layer 148 may have about 2 at % or less carbon. Silicon-containing layer 148 may also be doped with a dopant, such as boron, arsenic or phosphorus.

Figure 2F:
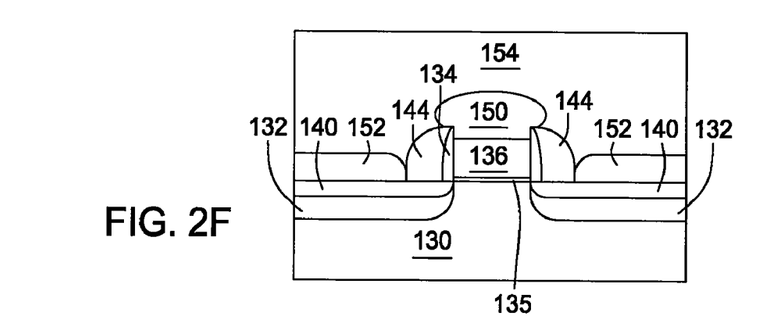

In the next step shown in FIG. 2F, a metal layer 154 is deposited over the features and the device is annealed. The metal layer 154 includes cobalt, nickel or titanium, among other metals. During the annealing process, polysilicon layer 146 and silicon-containing compound layer 148 are converted to metal silicide layers, 150 and 152, respectively. That is, when cobalt is deposited as metal layer 154, then metal silicide layers 150 and 152 are cobalt silicide.

The silicon-containing compound may be heavily doped with the in-situ dopants. Therefore, annealing steps of the prior art are omitted and the overall throughput is shorter. An increase of carrier mobility along the channel and subsequent drive current is achieved with the optional addition of germanium and/or carbon into the silicon-containing compound layer. Selectively grown epilayers of the silicon-containing compound above the gate oxide level can compensate junction consumption during the silicidation, which can relieve concerns of high series resistance of ultra shallow junctions. These two applications can be implemented together as well as solely for CMOS device fabrication.

Silicon-containing compounds are utilized within embodiments of the processes to deposit silicon-containing compounds films used for Bipolar (e.g., base, emitter, collector, emitter contact), BiCMOS (e.g., base, emitter, collector, emitter contact) and CMOS (e.g., channel, source/drain, source/drain extension, elevated source/drain, substrate, strained silicon, silicon on insulator and contact plug). Other embodiments of processes teach the growth of silicon-containing compounds films that can be used as gate, base contact, collector contact, emitter contact, elevated source/drain and other uses.

In one embodiment of the invention, a silicon-containing film is epitaxially grown as a Si film. A substrate (e.g., 300 mm OD) containing a semiconductor feature is placed into the process chamber. During this deposition technique, silicon precursor (e.g., silane or dichlorosilane) is flown concurrently into the process chamber with a carrier gas (e.g., $H_2$ and/or $N_2$) and an etchant (e.g., HCl). The flow rate of the silicon precursor is in the range from about 5 sccm to about 500 sccm, preferably from about 50 sccm to about 200 sccm. The flow rate of the carrier gas is from about 10 slm to about 30 slm. The flow rate of the etchant is from about 5 sccm to about 1,000 sccm, preferably from about 30 sccm to about 500 sccm. The process chamber is maintained with a pressure from about 0.1 Torr to about 200 Torr, preferably from about 1 Torr to about 50 Torr. The substrate is kept at a temperature in the range from about 500° C. to about 1,000° C., preferably from about 600° C. to about 900° C., more preferably from about 650° C. to about 750° C., for example about 720° C. The mixture of reagents is thermally driven to react and epitaxially deposit crystalline silicon. The HCl etches any deposited amorphous silicon or polycrystalline silicon from dielectric features upon the surface of the substrate. The process is conducted to form the deposited silicon film with a thickness in a range from about 10 Å to about 3,000 Å, for example, from about 40 Å to about 100 Å. In another example, the deposited silicon-containing film has a thickness in a range from about 200 Å to about 600 Å. In one embodiment, the silicon-containing film has a thickness greater than 500 Å, such as about 1,000 Å.

Etchants are utilized to control the areas on the device to be free of deposited silicon-containing compound. Etchants that are useful during deposition processes of the invention include HCl, HF, HBr, $Si_2Cl_6$, $SiCl_4$, $Cl_2SiH_2$, $CCl_4$, $Cl_2$, and combinations thereof. Other silicon precursors, besides silane and dichlorosilane, which are useful while depositing silicon-containing compounds include higher silanes, halogenated silanes, and organosilanes. Higher silanes include the compounds with the empirical formula $Si_xH_{(2x+2)}$, such as disilane ($Si_2H_6$), trisilane ($Si_3H_8$), and tetrasilane ($Si_4H_{10}$), as well as others. Halogenated silanes include compounds with the empirical formula $X'_ySi_xH_{(2x+2-y)}$, where X'=F, Cl, Br or I, such as hexachlorodisilane ($Si_2Cl_6$), tetrachlorosilane ($SiCl_4$), dichlorosilane ($Cl_2SiH_2$), and trichlorosilane ($Cl_3SiH$). Organosilanes include compounds with the empirical formula $R_ySi_xH_{(2x+2-y)}$, where R=methyl, ethyl, propyl, or butyl, such as methylsilane (($CH_3$)$SiH_3$), dimethylsilane (($CH_3$)$_2SiH_2$), ethylsilane (($CH_3CH_2$)$SiH_3$), methyldisilane (($CH_3$)$Si_2H_5$), dimethyldisilane (($CH_3$)$_2Si_2H_4$), and hexamethyldisilane (($CH_3$)$_6Si_2$). Organosilane compounds have been found to be advantageous silicon sources and carbon sources during embodiments of the present invention to incorporate carbon in to deposited silicon-containing compound.

Carrier gases are used throughout the processes and include $H_2$, Ar, $N_2$, He, forming gas, and combinations thereof. In one example, $H_2$ is used as a carrier gas. In another example $N_2$ is used as a carrier gas. In one embodiment, a carrier gas during an epitaxial deposition process is conducted with neither $H_2$ nor atomic hydrogen. However, an inert gas is used as a carrier gas, such as $N_2$, Ar, He, and combinations thereof. Carrier gases may be combined in various ratios during some embodiments of the process. For example, a carrier gas may include $N_2$ and/or Ar to maintain available sites on the silicon-containing compound film. The presence of hydrogen on the silicon-containing compound surface limits the number of available sites (i.e., passivates) for Si or SiGe to grow when an abundance of $H_2$ is used as a carrier gas. Consequently, a passivated surface limits the growth rate at a given temperature, particularly at lower temperatures (e.g., <650° C.). Therefore, a carrier gas of $N_2$ and/or Ar may be used during a process at lower temperature and reduce the thermal budget without sacrificing growth rate.

In another embodiment of the invention, a silicon-containing film is epitaxially grown as a SiGe film. A substrate (e.g., 300 mm OD) containing a semiconductor feature is placed into the process chamber. During this deposition technique, silicon precursor (e.g., silane or dichlorosilane) is flown concurrently into the process chamber with a carrier gas (e.g., $H_2$ and/or $N_2$), a germanium source (e.g., $GeH_4$) and an etchant (e.g., HCl). The flow rate of the silicon precursor is in the range from about 5 sccm to about 500 sccm, preferably from about 50 sccm to about 200 sccm. The flow rate of the carrier gas is from about 10 slm to about 30 slm. The flow rate of the germanium source is from about 0.1 sccm to about 10 sccm, preferably from about 0.5 sccm to about 5 sccm. The flow rate of the etchant is from about 5 sccm to about 1,000 sccm, preferably from about 30 sccm to about 500 sccm. The process chamber is maintained with a pressure from about 0.1 Torr to about 200 Torr, preferably from about 1 Torr to about 5 Torr, for example, about 3 Torr. The substrate is kept at a temperature in the range from about 500° C. to about 1,000° C., preferably from about 700° C. to about 900° C. The reagent mixture is thermally driven to react and epitaxially deposit a silicon-containing compound, namely a silicon germanium film. The HCl etches any deposited amorphous SiGe compounds from dielectric features upon the surface of the substrate.

The process is conducted to form the deposited SiGe film with a thickness in a range from about 10 Å to about 3,000 Å, for example, from about 40 Å to about 100 Å. In another example, the deposited silicon-containing film has a thickness in a range from about 200 Å to about 600 Å. In one embodiment, the silicon-containing film has a thickness greater than 500 Å, such as about 1,000 Å. The germanium concentration may be graded within the SiGe film, preferably graded with a higher germanium concentration in the lower portion of the SiGe film than in the upper portion of the SiGe film. The germanium concentration is in the range from about 1 at % to about 30 at % of the SiGe compound, for example, about 20 at %.

Other germanium sources or precursors, besides germane, that are useful while depositing silicon-containing compounds include higher germanes and organogermanes. Higher germanes include the compounds with the empirical formula $Ge_xH_{(2x+2)}$, such as digermane ($Ge_2H_6$), trigermane ($Ge_3H_8$), and tetragermane ($Ge_4H_{10}$), as well as others. Organogermanes include compounds with the empirical formula $R_yGe_xH_{(2x+2-y)}$, where R=methyl, ethyl, propyl or butyl, such as methylgermane (($CH_3$)$GeH_3$), dimethylgermane (($CH_3$)$_2GeH_2$), ethylgermane (($CH_3CH_2$)$GeH_3$), methyldigermane (($CH_3$)$Ge_2H_5$), dimethyldigermane (($CH_3$)$_2Ge_2H_4$), and hexamethyldigermane (($CH_3$)$_6Ge_2$). Germanes and organogermane compounds have been found to be an advantageous germanium sources and carbon sources during embodiments of the present invention to incorporate germanium and carbon in to the deposited silicon-containing compounds, namely SiGe and SiGeC compounds. Germanium sources are often mixed with a carrier gas (e.g., $H_2$) to dilute and therefore better control the germanium doses. For example, a germanium source with a flow rate in the range from about 0.5 sccm to about 5 sccm is equivalent to a flow of 1% germanium source in a carrier gas with a flow rate in the range from about 50 sccm to about 500 sccm. Throughout the disclosure, the flow rate of germanium source ignores the flow rate of the carrier gas.

In one embodiment of the invention, a silicon-containing film is epitaxially grown as a doped Si film. A substrate (e.g., 300 mm OD) containing a semiconductor feature is placed into the process chamber. During this deposition technique, silicon precursor (e.g., silane or dichlorosilane) is flown concurrently into the process chamber with a carrier gas (e.g., $H_2$ and/or $N_2$), a dopant (e.g., $B_2H_6$) and an etchant (e.g., HCl). The flow rate of the silicon precursor is in the range from about 5 sccm to about 500 sccm, preferably from about 50 sccm to about 200 sccm. The flow rate of the carrier gas is from about 10 slm to about 30 slm. The flow rate of the dopant is from about 0.01 sccm to about 10 sccm, preferably from about 0.2 sccm to about 2 sccm. The flow rate of the etchant is from about 5 sccm to about 1,000 sccm, preferably from about 30 sccm to about 500 sccm. The process chamber is maintained with a pressure from about 0.1 Torr to about 200 Torr, preferably from about 1 Torr to about 5 Torr, for example, about 3 Torr. The substrate is kept at a temperature in the range from about 500° C. to about 1,000° C., preferably from about 700° C. to about 900° C. The mixture of reagents is thermally driven to react and epitaxially deposit doped silicon films. The HCl etches any deposited amorphous silicon or polycrystalline silicon from dielectric features upon the surface of the substrate.

The process is conducted to form the deposited, doped silicon-containing film with a thickness in a range from about 10 Å to about 3,000 Å, for example, from about 40 Å to about 100 Å. In another example, the deposited silicon-containing film has a thickness in a range from about 200 Å to about 600 Å. In one embodiment, the silicon-containing film has a thickness greater than 500 Å, such as about 1,000 Å. The dopant concentration may be graded within the Si film, preferably graded with a higher dopant concentration in the lower portion of the Si film than in the upper portion of the Si film.

Dopants provide the deposited silicon-containing compounds with various conductive characteristics, such as directional electron flow in a controlled and desired pathway required by the electronic device. Films of the silicon-containing compounds are doped with particular dopants to achieve the desired conductive characteristic. In one embodiment, the silicon-containing compound is doped p-type, such as by using diborane to add boron at a concentration in the range from about $10^{15}$ atoms/cm$^3$ to about $10^{21}$ atoms/cm$^3$. In one embodiment, the p-type dopant has a concentration of at least $5 \times 10^{19}$ atoms/cm$^3$. In another embodiment, the p-type dopant is in the range from about $1 \times 10^{20}$ atoms/cm$^3$ to about $2.5 \times 10^{21}$ atoms/cm$^3$. In another embodiment, the silicon-containing compound is doped n-type, such as with phosphorus and/or arsenic to a concentration in the range from about $10^{15}$ atoms/cm$^3$ to about $10^{21}$ atoms/cm$^3$.

Besides diborane, other boron containing dopants include boranes and organoboranes. Boranes include borane, triborane, tetraborane and pentaborane, while alkylboranes include compounds with the empirical formula $R_xBH_{(3-x)}$, where R=methyl, ethyl, propyl, or butyl and x=0, 1, 2, or 3. Alkylboranes include trimethylborane (($CH_3$)$_3$B), dimethylborane (($CH_3$)$_2$BH), triethylborane (($CH_3CH_2$)$_3$B), and diethylborane (($CH_3CH_2$)$_2$BH). Dopants also include arsine ($AsH_3$), phosphine ($PH_3$) and alkylphosphines, such as with the empirical formula $R_xPH_{(3-x)}$, where R=methyl, ethyl, propyl or butyl and x=0, 1, 2, or 3. Alkylphosphines include trimethylphosphine (($CH_3$)$_3$P), dimethylphosphine (($CH_3$)$_2$PH), triethylphosphine (($CH_3CH_2$)$_3$P) and diethylphosphine (($CH_3CH_2$)$_2$PH). Dopants are often mixed with a carrier gas (e.g., $H_2$) to dilute and therefore better control the doping doses. For example, a flow rate of dopant in the range from about 0.2 sccm to about 2 sccm is equivalent to a flow of 1% dopant in a carrier gas with a flow rate in the range from about 20 sccm to about 200 sccm. Throughout the disclosure, the flow rate of dopant ignores the flow rate of the carrier gas.

In another embodiment of the invention, a silicon-containing film is epitaxially grown to produce a doped SiGe film. A substrate (e.g., 300 mm OD) containing a semiconductor feature is placed into the process chamber. During this deposition technique, silicon precursor (e.g., silane or dichlorosilane) is flown concurrently into the process chamber with a carrier gas (e.g., $H_2$ and/or $N_2$), a germanium source (e.g., $GeH_4$), a dopant (e.g., $B_2H_6$) and an etchant (e.g., HCl). The flow rate of the silicon precursor is in the range from about 5 sccm to about 500 sccm, preferably from about 50 sccm to about 200 sccm. The flow rate of the carrier gas is from about 10 slm to about 30 slm. The flow rate of the germanium source is from about 0.1 sccm to about 10 sccm, preferably from about 0.5 sccm to about 5 sccm. The flow rate of the dopant is from about 0.01 sccm to about 10 sccm, preferably from about 0.2 sccm to about 3 sccm. The flow rate of the etchant is from about 5 sccm to about 1,000 sccm, preferably from about 30 sccm to about 500 sccm. The process chamber is maintained with a pressure from about 0.1 Torr to about 200 Torr, preferably from about 1 Torr to about 5 Torr, for example, about 3 Torr. The substrate is kept at a temperature in the range from about 500° C. to about 1,000° C., preferably from about 700° C. to about 900° C. The reagent mixture is thermally driven to react and epitaxially deposit a silicon-containing compound, namely a silicon germanium film. The HCl etches any deposited amorphous SiGe from features upon the surface of the substrate. The process is conducted to form the doped SiGe film with a thickness in a range from about 10 Å to about 3,000 Å, for example, from about 40 Å to about 100 Å. In another example, the deposited silicon-containing film has a thickness in a range from about 200 Å to about 600 Å. In one embodiment, the silicon-containing film has a thickness greater than 500 Å, such as about 1,000 Å. The germanium concentration and the dopant concentration may be graded within the doped SiGe film, preferably graded with a higher germanium concentration and/or dopant concentration in the lower portion of the doped SiGe film than in the upper portion of the doped SiGe film. The germanium concentration is in the range from about 1 at % to about 50 at %, preferably from about 15 at % to about 35 at % of the SiGe compound. The boron concentration is in the range from about $1\times10^{19}$ atoms/cm$^3$ to about $2.5\times10^{21}$ atoms/cm$^3$ of the SiGe compound, for example, about $1\times10^{20}$ atoms/cm$^3$.

In another embodiment of the invention, a silicon-containing film is epitaxially grown as a SiC film. A substrate (e.g., 300 mm OD) containing a semiconductor feature is placed into the process chamber. During this deposition technique, silicon precursor (e.g., silane or dichlorosilane) is flown concurrently into the process chamber with a carrier gas (e.g., H$_2$ and/or N$_2$), a carbon source (e.g., CH$_3$SiH$_3$) and an etchant (e.g., HCl). The flow rate of the silicon precursor is in the range from about 5 sccm to about 500 sccm, preferably from about 50 sccm to about 200 sccm. The flow rate of the carrier gas is from about 10 slm to about 30 slm. The flow rate of the carbon source is from about 0.1 sccm to about 15 sccm, preferably from about 0.3 sccm to about 5 sccm. The flow rate of the etchant is from about 5 sccm to about 1,000 sccm, preferably from about 30 sccm to about 500 sccm. The process chamber is maintained with a pressure from about 0.1 Torr to about 200 Torr, preferably from about 1 Torr to about 5 Torr, for example, about 3 Torr. The substrate is kept at a temperature in the range from about 500° C. to about 1,000° C., preferably from about 700° C. to about 900° C. The reagent mixture is thermally driven to react and epitaxially deposit a silicon-containing compound, namely a silicon carbon film. The HCl etches any deposited amorphous SiC compounds from dielectric features upon the surface of the substrate.

The process is conducted to form the deposited SiC film with a thickness in a range from about 10 Å to about 3,000 Å, for example, from about 40 Å to about 100 Å. In another example, the deposited silicon-containing film has a thickness in a range from about 200 Å to about 600 Å. In one embodiment, the silicon-containing film has a thickness greater than 500 Å, such as about 1,000 Å. The carbon concentration may be graded within the SiC film, preferably graded with a higher carbon concentration in the lower portion of the SiC film than in the upper portion of the SiC film. The carbon concentration of the SiC film is in the range from about 200 ppm to about 5 at %, preferably from about 1 at % to about 3 at %, for example 1.5 at %.

Carbon sources useful for depositing silicon-containing compounds containing carbon include organosilanes, alkyls, alkenes and alkynes of ethyl, propyl and butyl. Such carbon sources include methylsilane (CH$_3$SiH$_3$), dimethylsilane ((CH$_3$)$_2$SiH$_2$), ethylsilane (CH$_3$CH$_2$SiH$_3$), methane (CH$_4$), ethylene (C$_2$H$_4$), ethyne (C$_2$H$_2$), propane (C$_3$H$_8$), propene (C$_3$H$_6$), butyne (C$_4$H$_6$), as well as others. Carbon sources are often mixed with a carrier gas (e.g., H$_2$) to dilute and therefore better control the carbon doses. For example, a carbon source with a flow rate in the range from about 0.3 sccm to about 5 sccm is equivalent to a flow of 1% carbon source in a carrier gas with a flow rate in the range from about 30 sccm to about 500 sccm. Throughout the disclosure, the flow rate of carbon source ignores the flow rate of the carrier gas.

In another embodiment of the invention, a silicon-containing film is epitaxially grown to produce a doped SiC film. A substrate (e.g., 300 mm OD) containing a semiconductor feature is placed into the process chamber. During this deposition technique, silicon precursor (e.g., silane or dichlorosilane) is flown concurrently into the process chamber with a carrier gas (e.g., H$_2$ and/or N$_2$), a carbon source (e.g., CH$_3$SiH$_3$), a dopant (e.g., B$_2$H$_6$) and an etchant (e.g., HCl). The flow rate of the silicon precursor is in the range from about 5 sccm to about 500 sccm, preferably from about 50 sccm to about 200 sccm. The flow rate of the carrier gas is from about 10 slm to about 30 slm. The flow rate of the carbon source is from about 0.1 sccm to about 15 sccm, preferably from about 0.3 sccm to about 5 sccm. The flow rate of the dopant is from about 0.01 sccm to about 10 sccm, preferably from about 0.2 sccm to about 3 sccm. The flow rate of the etchant is from about 5 sccm to about 1,000 sccm, preferably from about 30 sccm to about 500 sccm. The process chamber is maintained with a pressure from about 0.1 Torr to about 200 Torr, preferably from about 1 Torr to about 5 Torr, for example, about 3 Torr. The substrate is kept at a temperature in the range from about 500° C. to about 1,000° C., preferably from about 700° C. to about 900° C. The reagent mixture is thermally driven to react and epitaxially deposit a silicon-containing compound, namely a doped silicon carbon film. The HCl etches any deposited amorphous SiC from features upon the surface of the substrate.

The process is conducted to form the doped SiC film with a thickness in a range from about 10 Å to about 3,000 Å, for example, from about 40 Å to about 100 Å. In another example, the deposited silicon-containing film has a thickness in a range from about 200 Å to about 600 Å. In one embodiment, the silicon-containing film has a thickness greater than 500 Å, such as about 1,000 Å. The carbon concentration and/or the dopant concentration may be graded within the doped SiC film, preferably graded with a higher carbon concentration and/or dopant concentration in the lower portion of the doped SiC film than in the upper portion of the doped SiC film. The carbon concentration of the doped SiC film is in the range from about 200 ppm to about 5 at %, preferably from about 1 at % to about 3 at %, for example 1.5 at %. The boron concentration is in the range from about $1\times10^{19}$ atoms/cm$^3$ to about $2.5\times10^{21}$ atoms/cm$^3$ of the SiGe compound, for example, about $1\times10^{20}$ atoms/cm$^3$.

In another embodiment of the invention, a silicon-containing film is epitaxially grown as a SiGeC film. A substrate (e.g., 300 mm OD) containing a semiconductor feature is placed into the process chamber. During this deposition technique, silicon precursor (e.g., silane or dichlorosilane) is flown concurrently into the process chamber with a carrier gas (e.g., H$_2$ and/or N$_2$), a germanium source (e.g., GeH$_4$), a carbon source (e.g., CH$_3$SiH$_3$) and an etchant (e.g., HCl). The flow rate of the silicon precursor is in the range from about 5 sccm to about 500 sccm, preferably from about 50 sccm to about 200 sccm. The flow rate of the carrier gas is from about 10 slm to about 30 slm. The flow rate of the germanium source is from about 0.1 sccm to about 10 sccm, preferably from about 0.5 sccm to about 5 sccm. The flow rate of the carbon source is from about 0.1 sccm to about 50 sccm, preferably from about 0.3 sccm to about 5 sccm. The flow rate of the etchant is from about 5 sccm to about 1,000 sccm, preferably from about 30 sccm to about 500 sccm. The process chamber is maintained with a pressure from about 0.1 Torr to about 200 Torr, preferably from about 1 Torr to about 5 Torr, for example, about 3 Torr. The substrate is kept at a temperature in the range from about 500° C. to about 1,000° C., preferably from about 500° C. to about 700° C. The reagent mixture is thermally driven to react and epitaxially deposit a silicon-containing compound, namely a silicon germanium carbon film. The HCl etches any deposited amorphous or polycrystalline SiGeC compounds from dielectric features upon the surface of the substrate.

The process is conducted to form the deposited SiGeC compound with a thickness in a range from about 10 Å to about 3,000 Å, for example, from about 40 Å to about 100 Å. In another example, the deposited silicon-containing compound has a thickness in a range from about 200 Å to about 600 Å. In one embodiment, the silicon-containing compound has a thickness greater than 500 Å, such as about 1,000 Å. The germanium concentration and/or the carbon concentration may be graded within the SiGeC film, preferably graded with a higher germanium concentration and/or carbon concentration in the lower portion of the SiGeC film than in the upper portion of the SiGeC film. The germanium is in the range from about 1 at % to about 50 at %, preferably from about 15 at % to about 35 at % of the SiGeC compound. The carbon concentration is in the range from about 200 ppm to about 5 at %, preferably from about 1 at % to about 3 at % of the SiGeC compound.

In another embodiment of the invention, a silicon-containing compound film is epitaxially grown as a doped SiGeC film. A substrate (e.g., 300 mm OD) containing a semiconductor feature is placed into the process chamber. During this deposition technique, silicon precursor (e.g., silane or dichlorosilane) is flown concurrently into the process chamber with a carrier gas (e.g., $H_2$ and/or $N_2$), a germanium source (e.g., $GeH_4$), a carbon source (e.g., $CH_3SiH_3$), a dopant (e.g., $B_2H_6$) and an etchant (e.g., HCl). The flow rate of the silicon precursor is in the range from about 5 sccm to about 500 sccm, preferably from about 50 sccm to about 200 sccm. The flow rate of the carrier gas is from about 10 slm to about 30 slm. The flow rate of the germanium source is from about 0.1 sccm to about 10 sccm, preferably from about 0.5 sccm to about 5 sccm. The flow rate of the carbon source is from about 0.1 sccm to about 50 sccm, preferably from about 0.3 sccm to about 5 sccm. The flow rate of the dopant is from about 0.01 sccm to about 10 sccm, preferably from about 0.2 sccm to about 3 sccm. The flow rate of the etchant is from about 5 sccm to about 1,000 sccm, preferably from about 30 sccm to about 500 sccm. The process chamber is maintained with a pressure from about 0.1 Torr to about 200 Torr, preferably from about 1 Torr to about 5 Torr, for example, about 3 Torr. The substrate is kept at a temperature in the range from about 500° C. to about 1,000° C., preferably from about 500° C. to about 700° C. The reagent mixture is thermally driven to react and epitaxially deposit a silicon-containing compound, namely a doped silicon germanium carbon film. The HCl etches any deposited amorphous or polycrystalline SiGeC compounds from dielectric features upon the surface of the substrate.

The process is conducted to form a doped SiGeC compound with a thickness in a range from about 10 Å to about 3,000 Å, for example, from about 40 Å to about 100 Å. In another example, the deposited silicon-containing compound has a thickness in a range from about 200 Å to about 600 Å. In one embodiment, the silicon-containing compound has a thickness greater than 500 Å, such as about 1,000 Å. The germanium concentration, the carbon concentration and/or the dopant concentration may be graded within the doped SiGeC film, preferably graded with a higher germanium concentration, carbon concentration and/or dopant concentration in the lower portion of the doped SiGeC film than in the upper portion of the doped SiGeC film. The germanium concentration is in the range from about 1 at % to about 50 at %, preferably from about 15 at % to about 35 at % of the doped SiGeC compound. The carbon concentration is in the range from about 0.1 at % to about 5 at %, preferably from about 1 at % to about 3 at % of the doped SiGeC compound. The boron concentration is in the range from about $1 \times 10^{19}$ atoms/$cm^3$ to about $2.5 \times 10^{21}$ atoms/$cm^3$ of the SiGe compound, for example, about $1 \times 10^{20}$ atoms/$cm^3$.

In another embodiment of the invention, a second silicon-containing film is epitaxially grown by using dichlorosilane, subsequently to depositing any of the silicon-containing compounds aforementioned in the above disclosure. A substrate (e.g., 300 mm OD) containing any of the above described silicon containing compounds is placed into the process chamber. During this deposition technique, silicon precursor (e.g., $Cl_2SiH_2$) is flown concurrently into the process chamber with a carrier gas (e.g., $H_2$ and/or $N_2$), a germanium source (e.g., $GeH_4$) and an etchant (e.g., HCl). The flow rate of the dichlorosilane is in the range from about 5 sccm to about 500 sccm, preferably from about 50 sccm to about 200 sccm. The flow rate of the carrier gas is from about 10 slm to about 30 slm. The flow rate of the germanium source is from about 0.1 sccm to about 10 sccm, preferably from about 0.5 sccm to about 5 sccm. The flow rate of the etchant is from about 5 sccm to about 1,000 sccm, preferably from about 30 sccm to about 500 sccm. The process chamber is maintained with a pressure from about 0.1 Torr to about 200 Torr, preferably less than about 5 Torr, for example, about 3 Torr. The substrate is kept at a temperature in the range from about 500° C. to about 1,000° C., preferably from about 700° C. to about 900° C. The reagent mixture is thermally driven to react and epitaxially deposit a second silicon-containing compound, namely a silicon germanium film. The HCl etches any deposited amorphous or polycrystalline SiGe compounds from any dielectric features upon the surface of the substrate. The process is conducted to form the deposited SiGe compound with a thickness in a range from about 100 Å to about 3,000 Å and at a deposition rate between about 10 Å/min and about 100 Å/min, preferably at about 50 Å/min. The germanium concentration is in the range from about 1 at % to about 30 at % of the SiGe compound, preferably at about 20 at %. This embodiment describes a process to deposit a SiGe film, though substitution of silane with dichlorosilane to any of the previously described embodiments will produce a second silicon containing film. In another embodiment, a third silicon containing layer is deposited using any of the silane based process discussed above.

Therefore, in one embodiment, a silicon-containing compound laminate film may be deposited in sequential layers of silicon-containing compound by altering the silicon precursor between silane and dichlorosilane. In one example, a laminate film of about 2,000 Å is formed by depositing four silicon-containing compound layers (each of about 500 Å), such that the first and third layers are deposited using dichlorosilane and the second and fourth layers are deposited using silane. In another aspect of a laminate film, the first and third layers are deposited using silane and the second and fourth layers are deposited using dichlorosilane. The thickness of each layer is independent from each other; therefore, a laminate film may have various thicknesses of the silicon-containing compound layers.

In one embodiment, dichlorosilane is used to deposit the silicon-containing compound layer when the previous layer contains surface islands (e.g., contamination or irregularity to film). A process incorporating dichlorosilane may be less sensitive to the surface islands while depositing the silicon-containing compound layer over the previous layer. The use of dichlorosilane as the silicon source has a high horizontal or lateral growth rate relative to the use of silane. Once the surface island is covered and the silicon-containing compound layer has a consistent surface, dichlorosilane is replaced with silane and deposition of the silicon-containing compound layer is continued.

In another embodiment, the substrate surface may be exposed to ambient conditions, such as air including oxygen and/or water, between process steps. The ambient exposure is generally endured while shuffling substrates between multiple process chambers during the fabrication of devices. A first silicon-containing layer is deposited to the substrate surface, the substrate is exposed to ambient conditions, and subsequently, a second silicon-containing layer is deposited to the substrate surface. In one aspect, a cap-layer is deposited to the first silicon-containing layer before the ambient exposure. The cap-layer may be a dielectric material, such as silicon. For example, a silicon-germanium layer is deposited to the substrate surface, a silicon-cap layer is deposited to the silicon-germanium layer, the substrate is exposed to ambient conditions, and subsequently a second-silicon containing layer is deposited to the silicon-cap layer, such as a silicon layer or a silicon-carbon layer.

Embodiments of the invention teach processes to deposit silicon-containing compounds on many substrates and surfaces. Substrates on which embodiments of the invention may be useful include, but are not limited to semiconductor wafers, such as crystalline silicon (e.g., Si<100> and Si<111>), silicon oxide, silicon germanium, doped or undoped wafers and patterned or non-patterned wafers. Substrates have a variety of geometries (e.g., round, square and rectangular) and sizes (e.g., 200 mm OD, 300 mm OD). Surfaces and/or substrates include wafers, films, layers and materials with dielectric, conductive and barrier properties and include polysilicon, silicon on insulators (SOI), strained and unstrained lattices. Pretreatment of surfaces includes polishing, etching, reduction, oxidation, hydroxylation, annealing, and baking. In one embodiment, wafers are dipped into a 1% HF solution, dried and baked in a hydrogen atmosphere at 800° C.

In one embodiment, silicon-containing compounds include a germanium concentration within the range from about 0 at % to about 95 at %. In another embodiment, a germanium concentration is within the range from about 1 at % to about 30 at %, preferably from about 15 at % to about 30 at %, for example, about 20 at %. Silicon-containing compounds also include a carbon concentration within the range from about 0 at % to about 5 at %. In other aspects, a carbon concentration is within the range from about 200 ppm to about 3 at %, preferably about 1.5 at %.

The silicon-containing compound films of germanium and/or carbon are produced by various processes of the invention and can have consistent, sporadic or graded elemental concentrations. Graded silicon germanium films are disclosed in commonly assigned U.S. Ser. No. 09/866,172, published as U.S. Pub. No. 2002-0174826, and issued as U.S. Pat. No. 6,770,134 and commonly assigned U.S. Ser. No. 10/014,466, published as U.S. Pub. No. 2002-0174827, and issued as U.S. Pat. No. 6,905,542, which are both incorporated herein by reference in their entirety for the purpose of describing methods of depositing graded silicon-containing compound films. In one embodiment, a silicon source and a germanium source (e.g., $GeH_4$) are used to deposit silicon germanium containing films. In this embodiment, the ratio of silicon source and germanium source can be varied in order to provide control of the elemental concentrations, such as silicon and germanium, while growing graded films. In another embodiment, a silicon source and a carbon source (e.g., $CH_3SiH_3$) are used to deposit silicon carbon containing films. The ratio of silicon source and carbon source can be varied in order to provide control of the elemental concentration while growing homogenous or graded films. In another embodiment, a silicon source, a germanium source (e.g., $GeH_4$) and a carbon source (e.g., $CH_3SiH_3$) are used to deposit silicon germanium carbon containing films. The ratios of silicon, germanium and carbon sources are independently varied in order to provide control of the elemental concentration while growing homogenous or graded films.

MOSFET devices formed by processes described herein may contain a PMOS component or a NMOS component. The PMOS component, with a p-type channel, has holes that are responsible for channel conduction, while the NMOS component, with a n-type channel, has electrons that are responsible channel conduction. Therefore, for example, a silicon-containing material such as SiGe may be deposited in a recessed area to form a PMOS component. In another example, a silicon-containing film such as SiC may be deposited in a recessed area to form a NMOS component. SiGe is used for PMOS application for several reasons. A SiGe material incorporates more boron than silicon alone, thus the junction resistivity may be lowered. Also, the SiGe/silicide layer interface at the substrate surface has a lower Schottky barrier than the Si/silicide interface.

Further, SiGe grown epitaxially on the top of silicon has compressive stress inside the film because the lattice constant of SiGe is larger than that of silicon. The compressive stress is transferred in the lateral dimension to create compressive strain in the PMOS channel and to increase mobility of the holes. For NMOS application, SiC can be used in the recessed areas to create tensile stress in the channel, since the lattice constant of SiC is smaller than that of silicon. The tensile stress is transferred into the channel and increases the electron mobility. Therefore, in one embodiment, a first silicon-containing layer is formed with a first lattice strain value and a second silicon-containing layer is formed with a second lattice strain value. For example, a SiC layer with a thickness from about 50 Å to about 200 Å is deposited to the substrate surface and sequentially, a SiGe layer with a thickness from about 150 Å to about 1,000 Å is deposited to the SiC layer. The SiC layer may be epitaxially grown and has less strain than the SiGe layer epitaxially grown on the SiC layer.

In processes of the invention, silicon-containing compound films are grown by chemical vapor deposition (CVD) processes, wherein CVD processes include atomic layer deposition (ALD) processes and/or atomic layer epitaxy (ALE) processes. Chemical vapor deposition includes the use of many techniques, such as plasma-assisted CVD (PA-CVD), atomic layer CVD (ALCVD), organometallic or metalorganic CVD (OMCVD or MOCVD), laser-assisted CVD (LA-CVD), ultraviolet CVD (UV-CVD), hot-wire (HWCVD), reduced-pressure CVD (RP-CVD), ultra-high vacuum CVD (UHV-CVD), and others. In one embodiment, the preferred process of the present invention is to use thermal CVD to epitaxially grow or deposit the silicon-containing compound, whereas the silicon-containing compound includes silicon, SiGe, SiC, SiGeC, doped variants thereof and combinations thereof.

The processes of the invention can be carried out in equipment known in the art of ALE, CVD and ALD. The apparatus brings the sources into contact with a heated substrate on which the silicon-containing compound films are grown. The processes can operate at a range of pressures from about 0.1 Torr to about 200 Torr, preferably from about 0.5 Torr to about 50 Torr, and more preferably from about 1 Torr to about 10 Torr. Hardware that can be used to deposit silicon-containing films includes the Epi CENTURA® system and the POLY-GEN™ system available from Applied Materials, Inc., located in Santa Clara, Calif. An ALD apparatus is disclosed in commonly assigned U.S. Ser. No. 10/032,284, published as U.S. Pub. No. 2003-0079686, and issued as U.S. Pat. No. 6,916,398, is incorporated herein by reference in entirety for the purpose of describing the apparatus. Other apparatuses include batch, high-temperature furnaces, as known in the art.

EXAMPLES

Example 1

SiGe/Si stack: A substrate, Si<100>, (e.g., 300 mm OD) was employed to investigate selective, monocrystalline film growth by CVD. A dielectric feature existed on the surface of the wafer. The wafer was prepared by subjecting to a 1% HF dip for 45 seconds. The wafer was loaded into the deposition chamber (Epi CENTURA® chamber) and baked in a hydrogen atmosphere at 800° C. for 60 seconds to remove native oxide. A flow of carrier gas, hydrogen, was directed towards the substrate and the source compounds were added to the carrier flow. Dichlorosilane (100 sccm) and germane (1% $GeH_4$ in $H_2$, 280 sccm) were added to the chamber at 3 Torr and 725° C. Also, hydrogen chloride (190 sccm) and diborane (1% in $H_2$, 150 sccm) were delivered to the chamber. The substrate was maintained at 725° C. Deposition was conducted for about 5 minutes to form a 500 Å SiGe film with a germanium concentration of about 20 at % and the boron concentration of about $1.0 \times 10^{20}$ $cm^{-3}$. The substrate was removed from the process chamber and exposed to the ambient air. The substrate was loaded into a second deposition chamber (Epi CENTURA® chamber) and heated to 800° C. The substrate was exposed to a process gas containing silane (100 sccm) and hydrogen chloride (250 sccm) for about 10 minutes to selectively deposit a Si film on the SiGe film.

Example 2

Graded-SiGe/Si stack: A substrate, Si<100>, (e.g., 300 mm OD) was employed to investigate selective, monocrystalline film growth by CVD. A dielectric feature existed on the surface of the wafer. The wafer was prepared by subjecting to a 1% HF dip for 45 seconds. The wafer was loaded into the deposition chamber (Epi CENTURA® chamber) and baked in a hydrogen atmosphere at 800° C. for 60 seconds to remove native oxide. A first SiGe film was deposited by directing a hydrogen carrier gas towards the substrate and the source compounds were added to the carrier flow. Dichlorosilane (100 sccm) and germane (1% $GeH_4$ in $H_2$, 190 sccm) were added to the chamber at 3 Torr and 725° C. Also, hydrogen chloride (160 sccm) and diborane (1% in $H_2$, 150 sccm) were delivered to the chamber. The substrate was maintained at 725° C. Deposition was conducted for 2 minutes to form a 100 Å SiGe film with a germanium concentration of 15 at % and the boron concentration of about $5.0 \times 10^{19}$ $cm^{-3}$. A second SiGe film was deposited to the first SiGe film to form a graded-SiGe film. Dichlorosilane (100 sccm) and germane (1% $GeH_4$ in $H_2$, 350 sccm) were added to the chamber at 3 Torr and 725° C. Also, hydrogen chloride (250 sccm) and diborane (1% in $H_2$, 125 sccm) were delivered to the chamber. The substrate was maintained at 725° C. Deposition was conducted for about 5 minutes to form a 500 Å SiGe film with a germanium concentration of about 30 at % and the boron concentration of about $1.8 \times 10^{20}$ $cm^{-3}$. The substrate was removed from the process chamber and exposed to the ambient air. The substrate was loaded into a second deposition chamber (Epi CENTURA® chamber) and heated to 800° C. The substrate was exposed to a process gas containing silane (100 sccm) and hydrogen chloride (250 sccm) for about 10 minutes to selectively deposit a Si film on the SiGe film.

Example 3

SiC/Si stack: A substrate, Si<100>, (e.g., 300 mm OD) was employed to investigate selective, monocrystalline film growth by CVD. A dielectric feature existed on the surface of the wafer. The wafer was prepared by subjecting to a 1% HF dip for 45 seconds. The wafer was loaded into the deposition chamber (Epi CENTURA® chamber) and baked in a hydrogen atmosphere at 800° C. for 60 seconds to remove native oxide. A flow of carrier gas, hydrogen, was directed towards the substrate and the source compounds were added to the carrier flow. Dichlorosilane (100 sccm) and methylsilane (1% $CH_3SiH_3$ in $H_2$, 100 sccm) were added to the chamber at 3 Torr and 725° C. Also, hydrogen chloride (160 sccm) and diborane (1% in $H_2$, 150 sccm) were delivered to the chamber. The substrate was maintained at 725° C. Deposition was conducted for about 5 minutes to form a 500 Å SiC film with a carbon concentration of about 1.25 at % and the boron concentration of about $1.0 \times 10^{20}$ $cm^{-3}$. The substrate was removed from the process chamber and exposed to the ambient air. The substrate was loaded into a second deposition chamber (Epi CENTURA® chamber) and heated to 800° C. The substrate was exposed to a process gas containing silane (100 sccm) and hydrogen chloride (250 sccm) for about 10 minutes to selectively deposit a Si film on the SiC film.

Example 4

Graded-SiC/Si stack: A substrate, Si<100>, (e.g., 300 mm OD) was employed to investigate selective, monocrystalline film growth by CVD. A dielectric feature existed on the surface of the wafer. The wafer was prepared by subjecting to a 1% HF dip for 45 seconds. The wafer was loaded into the deposition chamber (Epi CENTURA® chamber) and baked in a hydrogen atmosphere at 800° C. for 60 seconds to remove native oxide. A first SiC film was deposited by directing a hydrogen carrier gas towards the substrate and the source compounds were added to the carrier flow. Dichlorosilane (100 sccm) and methylsilane (1% $CH_3SiH_3$ in $H_2$, 80 sccm) were added to the chamber at 3 Torr and 725° C. Also, hydrogen chloride (160 sccm) and diborane (1% in $H_2$, 100 sccm) were delivered to the chamber. The substrate was maintained at 725° C. Deposition was conducted for about 2 minutes to form a 100 Å SiGe film with a carbon concentration of 1.25 at % and the boron concentration of about $5 \times 10^{19}$ $cm^{-3}$. A second SiC film was deposited to the first SiC film to form a graded-SiC film. Dichlorosilane (100 sccm) and methylsilane (1% $CH_3SiH_3$ in $H_2$, 350 sccm) were added to the chamber at 3 Torr and 725° C. Also, hydrogen chloride (250 sccm) and diborane (1% in $H_2$, 150 sccm) were delivered to the chamber. The substrate was maintained at 725° C. Deposition was conducted for 5 minutes to form a 500 Å SiC film with a carbon concentration of 1.75 at % and the boron concentration of about $1.8 \times 10^{20}$ $cm^{-3}$. The substrate was removed from the process chamber and exposed to the ambient air. The substrate was loaded into a second deposition chamber (Epi CENTURA® chamber) and heated to 800° C. The substrate was exposed to a process gas containing silane (100 sccm) and hydrogen chloride (250 sccm) for about 10 minutes to selectively deposit a Si film on the SiC film.

Example 5

SiGeC/Si stack: A substrate, Si<100>, (e.g., 300 mm OD) was employed to investigate selective, monocrystalline film growth by CVD. A dielectric feature existed on the surface of the wafer. The wafer was prepared by subjecting to a 1% HF dip for 45 seconds. The wafer was loaded into the deposition chamber (Epi CENTURA® chamber) and baked in a hydrogen atmosphere at 800° C. for 60 seconds to remove native oxide. A flow of carrier gas, hydrogen, was directed towards the substrate and the source compounds were added to the carrier flow. Dichlorosilane (100 sccm), germane (1% $GeH_4$ in $H_2$, 190 sccm) and methylsilane (1% $CH_3SiH_3$ in $H_2$, 100 sccm) were added to the chamber at 3 Torr and 725° C. Also, hydrogen chloride (220 sccm) and diborane (1% in $H_2$, 150 sccm) were delivered to the chamber. The substrate was maintained at 725° C. Deposition was conducted for about 5 minutes to form a 500 Å SiGeC film with a germanium concentration of about 20 at % a carbon concentration of about 1.5 at % and the boron concentration of about $1.0 \times 10^{20}$ $cm^3$. The substrate was removed from the process chamber and exposed to the ambient air. The substrate was loaded into a second deposition chamber (Epi CENTURA® chamber) and heated to 800° C. The substrate was exposed to a process gas containing silane (100 sccm) and hydrogen chloride (250 sccm) for about 10 minutes to selectively deposit a Si film on the SiGeC film.

While the foregoing is directed to embodiments of the present invention, other and further embodiments of the invention may be devised without departing from the basic scope thereof, and the scope thereof is determined by the claims that follow.

The invention claimed is:

1. A method for forming a silicon-based material on a substrate surface, comprising:
    exposing a substrate to a first process gas comprising silane, a germanium source, a carbon source, a first etchant comprising HCl, and a carrier gas to selectively and epitaxially deposit a first silicon-containing layer on the substrate at a pressure within a range from about 0.5 Torr to about 50 Torr, wherein the first silicon-containing layer comprises a graded carbon concentration and has interstitial sites within a crystalline lattice and comprises about 3 at % or less of carbon within the interstitial sites;
    exposing the substrate to a second process gas comprising dichlorosilane and a second etchant comprising HCl to selectively and epitaxially deposit a second silicon-containing layer on the first silicon-containing layer; and
    annealing the substrate to incorporate at least a portion of the carbon into substitutional sites of the crystalline lattice within the first silicon-containing layer.

2. The method of claim 1, wherein the substrate is exposed to the first process gas comprising:
    the silane at a flow rate within a range from about 20 sccm to about 400 sccm;
    the carbon source at a flow rate within a range from about 0.3 sccm to about 5 sccm;
    the first etchant at a flow rate within a range from about 30 sccm to about 500 sccm; and
    the carrier gas at a flow rate within a range from about 10 slm to about 30 slm.

3. The method of claim 2, wherein the first silicon-containing layer is deposited on the substrate within a processing chamber having an internal pressure within a range from about 1 Torr to about 10 Torr.

4. The method of claim 1, wherein the first process gas further comprises a dopant precursor.

5. The method of claim 4, wherein the dopant precursor is selected from the group consisting of diborane, arsine, phosphine, and derivatives thereof.

6. The method of claim 5, wherein the first silicon-containing layer comprises a graded dopant concentration.

7. The method of claim 1, wherein the first silicon-containing layer has a boron concentration within a range from about $5 \times 10^{19}$ atoms/$cm^3$ to about $1 \times 10^{20}$ atoms/$cm^3$.

8. The method of claim 1, wherein the first silicon-containing layer has a boron concentration greater than $1 \times 10^{20}$ atoms/$cm^3$.

9. The method of claim 8, wherein the boron concentration is about $2 \times 10^{20}$ atoms/$cm^3$ or greater.

10. The method of claim 1, wherein the second silicon-containing layer has a boron concentration greater than $1 \times 10^{20}$ atoms/$cm^3$.

11. The method of claim 10, wherein the boron concentration is about $2 \times 10^{20}$ atoms/$cm^3$ or greater.

12. The method of claim 1, wherein the carbon source comprises methylsilane.

13. A method for forming a silicon-based material on a substrate surface, comprising:
    exposing a substrate to a first process gas comprising silane, a carbon source, a germanium source, a first etchant comprising HCl, and a carrier gas to selectively and epitaxially deposit a first silicon-containing layer on the substrate at a pressure within a range from about 0.5 Torr to about 50 Torr, wherein the first silicon-containing layer has interstitial sites within a crystalline lattice and comprises about 3 at % or less of carbon within the interstitial sites;
    exposing the substrate to a second process gas comprising dichlorosilane and a second etchant comprising HCl to selectively and epitaxially deposit a second silicon-containing layer on the first silicon-containing layer; and
    annealing the substrate to incorporate at least a portion of the carbon into substitutional sites of the crystalline lattice within the first silicon-containing layer.

14. The method of claim 13, wherein the carbon source is methylsilane.

15. The method of claim 13, wherein the first silicon-containing layer or the second silicon-containing layer has a boron concentration greater than $1 \times 10^{20}$ atoms/$cm^3$.

16. The method of claim 15, wherein the boron concentration is about $2 \times 10^{20}$ atoms/$cm^3$ or higher.

* * * * *